A simple constitution together with an easy calibration of output by realizing a fast light intensity detection method is realized without using the carrier signal.

An optical sensor, including: a sensor to which light from a light source is lead, and by which light intensity of the light is modulated based on a physical value; light receiving elements 61 and 62 receiving two elements of divided light PA and PB having polarized waves which are orthogonally crossing each other; a variable optical attenuator operating light which is received by the light receiving elements 61 and 62; and a variable amplifier operating output signals from the light receiving elements 61 and 62, wherein both a zero point of a sensor output and sensitivity are calibrated based on a light attenuation factor or an amplification factor which is adjusted when a physical value is detected by calculating a ratio between a sum and a difference of outputs of the light receiving elements 61 and 62.

6 Claims, 7 Drawing Sheets

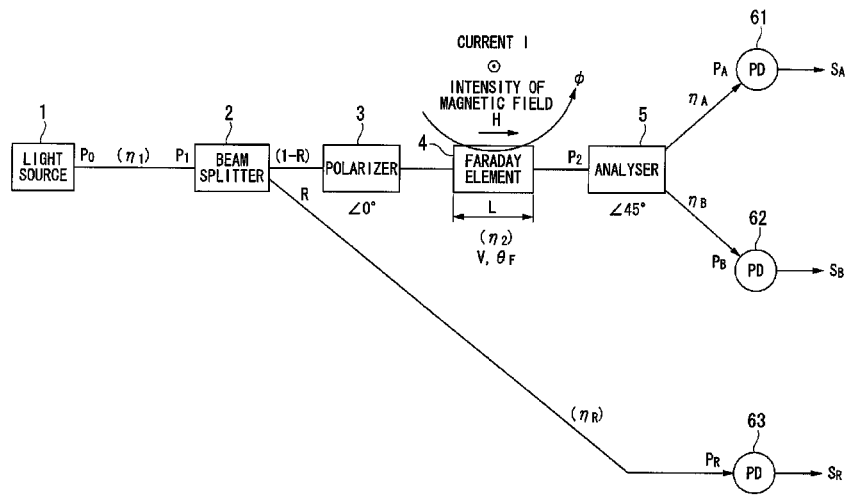

U.S. PATENT DOCUMENTS

| | | | |
|---|---|---|---|
| 3,707,329 | A | 12/1972 | Jaecklin et al. |
| 4,112,367 | A | 9/1978 | Hepner et al. |
| 4,564,754 | A | 1/1986 | Sato et al. |
| 4,694,243 | A | 9/1987 | Miller et al. |
| 4,725,140 | A | 2/1988 | Musha |
| 4,797,607 | A | 1/1989 | Dupraz |
| 4,916,387 | A | 4/1990 | Miller |
| 5,063,290 | A | 11/1991 | Kersey |
| 5,125,744 | A | 6/1992 | Watanabe |
| 5,136,235 | A | 8/1992 | Brandle et al. |
| 5,363,363 | A | 11/1994 | Gage |
| 5,491,682 | A | 2/1996 | Dohmeier et al. |
| 5,656,934 | A | 8/1997 | Bosselmann |
| 5,764,046 | A | 6/1998 | Bosselmann |
| 5,811,964 | A | 9/1998 | Bosselmann et al. |
| 5,834,933 | A | 11/1998 | Meier |
| 5,847,560 | A | 12/1998 | Bosselmann et al. |
| 5,895,912 | A | 4/1999 | Bosselmann et al. |
| 6,114,846 | A | 9/2000 | Bosselmann et al. |
| 6,122,415 | A | 9/2000 | Blake |
| 6,140,634 | A | 10/2000 | Bosselmann |
| 6,154,022 | A | 11/2000 | Willsch et al. |
| 6,208,129 | B1 | 3/2001 | Willsch et al. |
| 6,417,660 | B2 | 7/2002 | Menke |
| 6,479,979 | B1 * | 11/2002 | Kingsley et al. ............... 324/96 |
| 6,495,999 | B1 | 12/2002 | Beierl et al. |
| 6,504,355 | B2 | 1/2003 | Minier |
| 6,563,589 | B1 * | 5/2003 | Bennett et al. ............... 356/483 |
| 6,618,153 | B2 | 9/2003 | Lin et al. |
| 6,630,819 | B2 | 10/2003 | Lanagan et al. |
| 6,724,179 | B2 | 4/2004 | Kingsley et al. |
| 6,946,827 | B2 | 9/2005 | Rahmatian et al. |
| 6,952,107 | B2 | 10/2005 | Rahmatian |
| 2002/0000801 | A1 | 1/2002 | Menke |
| 2002/0011831 | A1 | 1/2002 | Minier |
| 2002/0145414 | A1 | 10/2002 | Lanagan et al. |
| 2003/0042884 | A1 | 3/2003 | Kingsley et al. |
| 2003/0117125 | A1 | 6/2003 | Rahmatian et al. |
| 2003/0117126 | A1 | 6/2003 | Rahmatian |
| 2009/0090842 | A1 | 4/2009 | Kurosawa et al. |

FOREIGN PATENT DOCUMENTS

| | | |
|---|---|---|
| JP | 59-061783 A | 4/1984 |
| JP | 64-088373 | 4/1989 |
| JP | 3-282383 A | 12/1991 |
| JP | 11-264766 A | 9/1999 |
| JP | 2000-266787 A | 9/2000 |

OTHER PUBLICATIONS

International Search Report by Japanese Patent Office on May 23, 2006.

International Search Report by Japanese Patent Office dated May 23, 2006.

Technical data on optical fiber sensor: revised edition, edited by Toshihiko Yoshino, 1986, pp. 404-405.

Kiyoshi Kurosawa, "Development of Optical Fiber Current Sensors and Their Applications", Journal of the Institute of Electrostatics Japan, vol. 28 No. 5, 2004, pp. 251-257.

M. Takahashi et al. "Sagnac Interferometer-type fiber-optic current sensor using single-mode fiber down leads", Technical Digest of 16$^{th}$ International conference on optical fiber sensor, 2003, pp. 756-759.

Kiyoshi Kurosawa, "Investigation on Basic Characteristics of Optical Current Transducer Applying Optical Heterodyning Technique", The institute of Electrical Engineers of Japan, Transactions on Power and Energy, vol. B 117, No. 3, 1997, pp. 354-363.

* cited by examiner

OPTICAL SENSOR, OPTICAL CURRENT SENSOR AND OPTICAL VOLTAGE SENSOR

RELATED APPLICATIONS

This application relates to U.S. patent application Ser. No. 11/817,955 filed on Sep. 6, 2007 and entitled "INTENSITY MODULATION TYPE OPTICAL SENSOR AND OPTICAL CURRENT/VOLTAGE SENSOR."

BACKGROUND OF THE INVENTION

1. Field of the Invention

The present invention relates to optical sensors, especially an optical current sensor and an optical voltage sensor which can measure a wide range of current and voltage from a DC to a high frequency AC.

2. Description of the Related Art

In recent years, developments and practical applications of an optical fiber AC sensor by using the Faraday effect have been proposed (for example, see non-patent document 1: Kurosawa "Development and Application of Optical Fiber Current Sensor", Journal of the Institute of Electrostatics Japan, vol. 28 No. 5 (p. 251-257), 2004). Along with the development of the optical fiber AC sensor, it has been expected to realize an optical fiber DC sensor that can be applied to both a power electronics machine and a DC transmission facility/DC substation equipment using the power electronics machine.

With respect to such a DC sensor, it is necessary to detect not only a DC (component having zero frequency), but also both a DC generated from superimposed components of high frequency and a current having a short rise time (1 msec or less, in some cases, 1 μsec). However, with respect to these necessities, there are problems such as an application of technologies developed for AC, a method of setting a zero point (a method of setting an output 0 when a measured current is 0), a method of adjusting the sensitivity (adjusting a reset value of the sensitivity of output) and moreover the stabilization of set values. Regarding an intensity modulation type AC sensor, as described in non-patent document 1, these problems have been solved by using a method of calculating a degree of modulation of a received signal.

However, it is not possible to apply the method of calculating the degree of modulation to a DC. Therefore, for example, a method of using a Sagnac interferometer which is used in a fiber optic gyro (for example, see non-patent document 2: M. Takahashi, et al. "Sagnac Interferometer-type fiber-optic current sensor using single-mode fiber down leads" Technical Digest of 16th International conference on optical fiber sensor) and a method of using an optical heterodyne (for example, see non-patent document 3: Kurosawa "Study of Fundamental Characteristics of Photocurrent Transformer using Optical Heterodyne Method", volume B117, No. 3 (p. 354-363), 1997, The Institute of Electrical Engineers of Japan, Transactions on Power and Energy) are currently developed. FIG. 8 is a drawing which shows a method described in non-patent document 2, and an outline of the method is explained below.

Light emitted from a light source is converted to be linear polarized light after passing through a coupler 1, a depolarizer and a light polarizer. The linear polarized light is divided into a pair of beams by a coupler 2, and the beams pass into a loop fiber interferometer as incident light. The beams rotate in opposite directions to each other inside a loop. The pair of the beams is propagated through a sensor fiber after being converted to circularly polarized waves by a quarter-wave plate. In this step, a magnetic field induce by a measured current is applied to the sensor fiber, and a difference of propagation velocities between the pair of the beams is caused because of the Faraday effect. The pair of the beams reaches light receiving elements after being optically multiplexed by the coupler 2, and a phase difference, in other words, an intensity difference of received light according to a current is caused. Values of the current are calculated based on this intensity difference of received light.

A system described above has a constitution in which, in order to maintain the sensitivity and in order to maintain the stability of output even if the intensity of received light fluctuates, a carrier signal is generated by modulating light by using a piezoelectric vibrator (PZT), and the carrier is further modulated because of the Faraday effect. As such, it is possible to obtain a system output by demodulating the carrier. In other words, in FIG. 8, a reference signal generator, a vibrator activating portion and a piezoelectric vibrator are provided in order to generate the modulated signal.

Moreover, in order to improve the efficiency of modulation, an appended fiber (for example, approximately 100 m) is provided. Furthermore, in order to maintain the depth of modulation so as to be a certain level, after extracting second-harmonic waves and fourth-harmonic waves included in the received signal, a ratio between second-harmonic waves and fourth-harmonic waves is calculated and a signal which is proportional to the ratio is output to a modulation circuit in order to conduct a feedback operation. Regarding a signal operation portion, it is necessary to provide a synchronous detector and the like, which are rather complex components.

In a case of using a Sagnac interferometer, it is necessary to conduct modulation because if the modulation is not conducted, the sensitivity of the system is theoretically zero when a current is small. Moreover, in this case, in order to maintain a measurement accuracy of the system, other than modulation and demodulation, it is necessary to select optical components such as a ¼ plate, a polarizer and a depolarizer which have high accuracy.

As described above, a Sagnac interferometer has the following problems.

i) A delicate and complex optical system is necessary.
ii) A complex signal operation circuit is necessary.
iii) It is difficult to improve a response speed because complex operations such as generating the carrier signal and a modulation and demodulation are conducted. In order to improve a response speed, it is necessary to increase the frequency of the carrier. However, in this case, the modulation power increases and pressure on the signal operation circuit increases too.

SUMMARY OF THE INVENTION

Therefore, an object of the present invention is to provide a simple constitution together with an easy adjustment of zero point and an easy calibration of output by realizing a light intensity detection method in which information is indicated by using the intensity of a high speed (high response speed, short rise time) received signal without using the carrier signal.

In order to solve these problems, the invention of Claim 1 is characterized by including: a sensor constituted from an optical portion to which light from a light source is lead, and by which the light intensity of the light is modulated based on a physical value; a first light receiving element and a second light receiving element receiving two elements of divided light having polarized waves which are orthogonally crossing each other; a variable optical attenuator operating light which is received by the first and the second light receiving elements; and a variable amplifier operating output signals from the first and the second light receiving elements, wherein both a zero point and sensitivity of a sensor output can be calibrated based on a light attenuation factor or an amplification factor which is adjusted when a physical value is detected by calculating a ratio between a sum and a difference of outputs of the first and the second light receiving elements.

The invention of Claim 2 is characterized by including: a sensor constituted from an optical portion to which light from a light source is lead, and by which light intensity of the light is modulated based on a physical value; a first light receiving element and a second light receiving element receiving two elements of divided light having polarized waves which are orthogonally crossing each other; a third light receiving element directly receiving light from the light source; a variable optical attenuator operating both light which is received by one of the first and the second light receiving elements and light received by the third light receiving element; and a variable amplifier operating both an output signal from one of the first and the second light receiving elements and an output signal from the third light receiving element, wherein both a zero point and sensitivity of a sensor output are calibrated based on a light attenuation factor or an amplification factor which is adjusted when a physical value is detected by calculating a ratio between the output of the third light receiving element and a difference between one of the outputs from the first and second light receiving elements and the third light receiving element.

It is possible to obtain an optical current sensor by applying the principle of the Faraday effect to the above-described inventions of Claims 1 and 2 (invention of Claim 3), and it is possible to obtain an optical voltage sensor by applying the principle of Pockels effect to the above-described inventions of Claims 1 and 2 (invention of Claim 4).

In accordance with the present invention, a light intensity detection method in which information is indicated by using the intensity of a high speed (high response speed, short rise time) received signal without using the carrier signal is realized. Therefore, a significantly simple constitution together with an easy adjustment of zero point and an easy calibration of output by realizing is achieved. As a result, an advantage is obtained in which it is possible to measure a wide range of current and voltage from a DC to a high frequency AC.

DETAILED DESCRIPTION OF THE INVENTION

Figure 1:
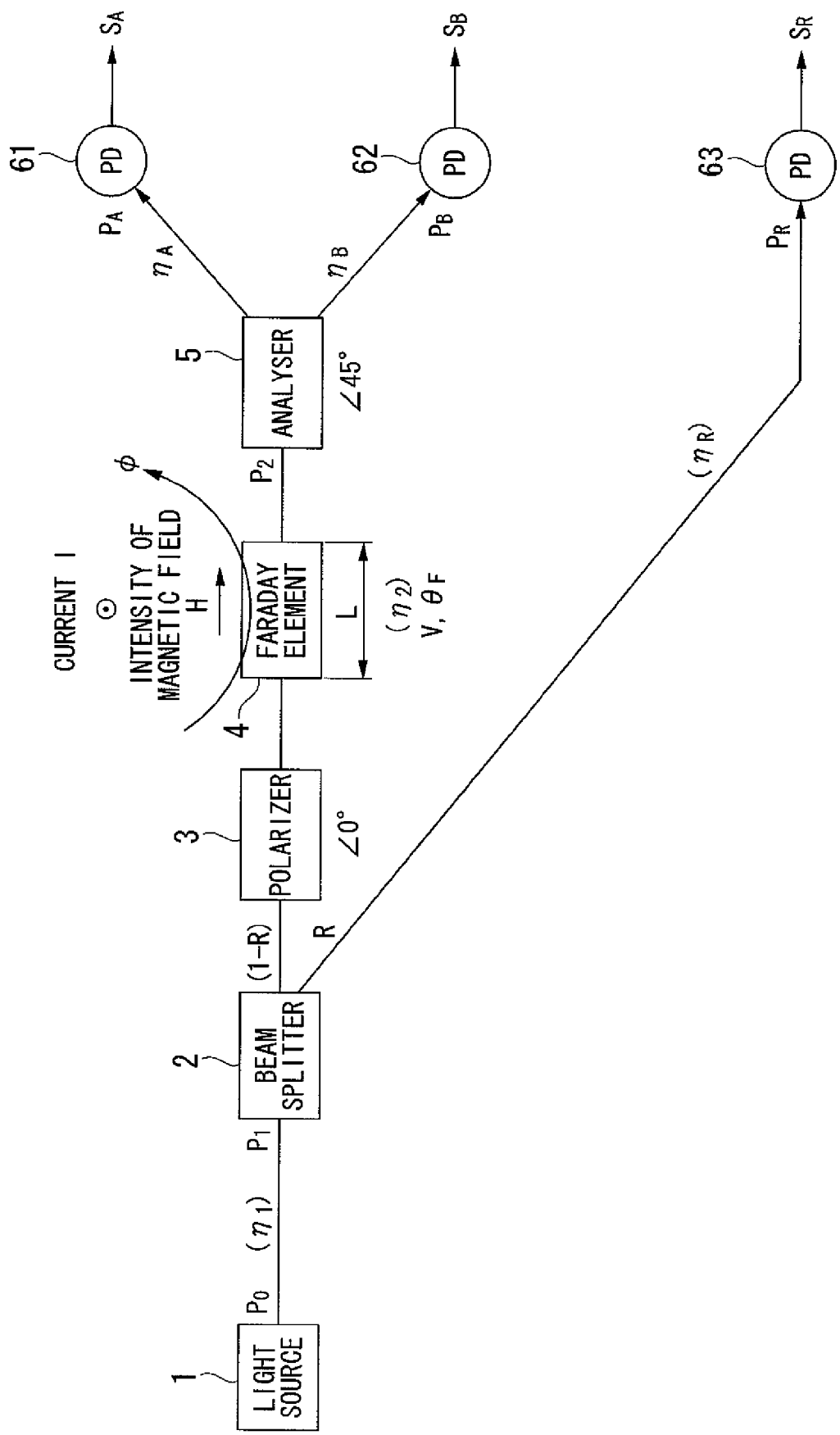
FIG. 1 is a drawing which explains a principle of the present invention.

FIG. 1 is a drawing which shows a principle constitution of the present invention.

In FIG. 1, 1 is a light source, 2 is a beam splitter, 3 is a light polarizer, 4 is a Faraday cell, 5 is an analyser, and 61-63 are light receiving elements such as photodiodes (PD).

Now, a separation ratio of the beam splitter 2 is R, a transmission efficiency regarding a quantity of light is η, a length of the Faraday cell 4 is L, a Faraday rotation angle is θ, a Verdet constant is V and an intensity of a magnetic field generated by a current I is H. Followings are defined.

$$|2\theta_F| \ll \pi/2, \theta_F = VHL = VI \tag{1}$$

Quantity of light $P_A$, $P_B$ and $P_R$ which reach the light receiving elements 61-63 are shown by using the following equations.

$$P_A = \eta_1 * \eta_1 * \eta_A * (1-R)(1/2)P_0(1+2\theta_F) \tag{2}$$

$$P_B = \eta_1 * \eta_2 * \eta_B * (1-R)(1/2)P_0(1-2\theta_F) \tag{3}$$

$$P_R = \eta_1 * \eta_R * R * P_0 \tag{4}$$

In an ideal case, the following equations are applied.

$$R = 0 \tag{5}$$

$$\eta_1 = \eta_2 = \eta_R = \eta_A = \eta_B = 1 \tag{6}$$

Therefore, the following equations are obtained by applying equations (5) and (6) to equations (2)-(4).

$$P_A = (1/2)P_0(1+2\theta_F) \tag{7}$$

$$P_B = (1/2)P_0(1-2\theta_F) \tag{8}$$

$$P_R = 0 \tag{9}$$

(1) Two-signals Method

This is a method which uses both signals $P_A$ and $P_B$. Here, equation (7)+equation (8) is obtained as follows.

$$P_A + P_B = P_0 \tag{10}$$

$$P_A - P_B = P_0 * 2\theta_F \tag{11}$$

Therefore, a degree of modulation $M_2$ is shown as follows.

$$M_2 = (P_A - P_B)/(P_A + P_B) = 2\theta_F \tag{12}$$

Figure 2:
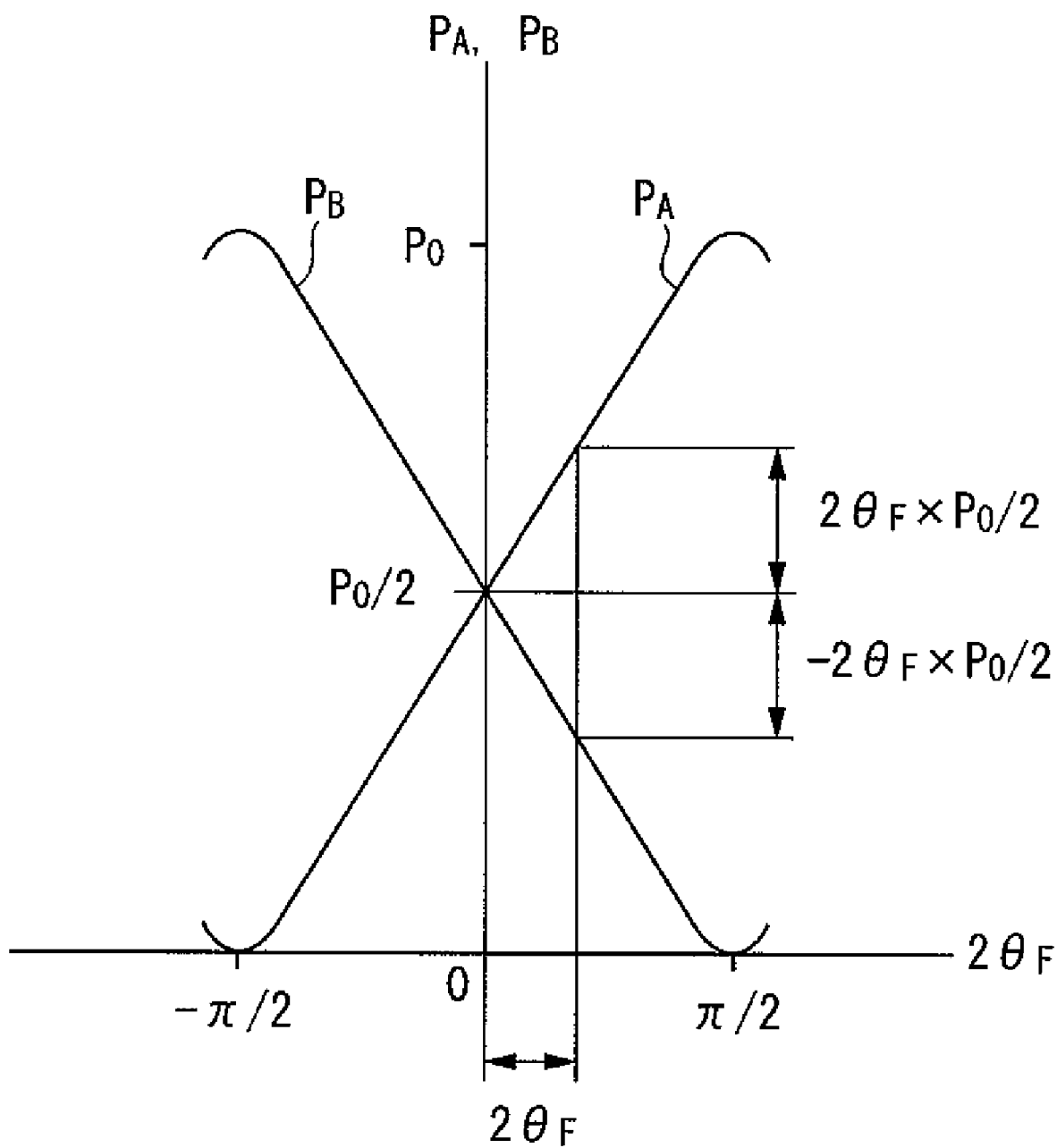
FIG. 2 is a drawing which explains a relationship among $P_A$, $P_B$ and $\theta_F$ of FIG. 1.

FIG. 2 shows a relationship among $P_A$, $P_B$ and $\theta_F$.

In other words, in an ideal situation, it is possible to maintain accuracy by outputting the degree of modulation $M_2$ as a sensor output. However, in a practical case, $\eta_1$, $\eta_2$, $\eta_R$, $\eta_A$, $\eta_B \neq 1$. Therefore, the degree of modulation $M_2$ is obtained as follows by applying R=0 based on the above-described equations (2) and (3).

$$M_2 = (P_A - P_B)/(P_A + P_B) = \{\eta_A(1+2\theta_F) - \eta_B(1-2\theta_F)\}/\{\eta_A(1+2\theta_F) + \eta_B(1-2\theta_F)\} \tag{13}$$

Therefore, it is clearly understood that $M_2 \neq 2\theta_F$ unless $\eta_A = \eta_B$.

Therefore, it is not possible to maintain the accuracy of the sensor output if $M_2$ is directly calculated as shown in equation (12). The following equations are obtained by multiplying coefficients $G_A$ and $G_B$ and the amount of light $P_A$ and $P_B$ radiated on the light receiving elements 61 and 62.

$$P_A' = G_A P_A \tag{14}$$

$$P_B' = G_B P_B \tag{15}$$

The degree of modulation $M_2$ is obtained as follows by applying $P_A$ and $P_B$ of the above-described equation (13).

$$M_2 = \{G_A\eta_A(1+2\theta_F) - G_B\eta_B(1-2\theta_F)\}/\{G_A\eta_A(1+2\theta_F) + G_B\eta_B(1-2\theta_F)\} \tag{16}$$

Now, an equation $G_A\eta_A=G_B\eta_B$ ... (17) is applied to (16), and the following equation is obtained.

$$M_2=2\theta_F \quad (18)$$

It is possible to adjust $G_A$ and $G_B$ so as to have $M_2=0$ if $\theta_F=0$ (2) One-signal Method This method is a method in which one signal is used. Here, for example, $P_A$ is used and the following equation (7) shows $P_A$.

$$P_A=(1/2)P_0(1+2\theta_F) \quad (7)$$

$P_0/2$ is subtracted from the above-described equation (7) in order to obtain the degree of modulation $M_1$.

$$M_1=P_A-P_0/2=\theta_F \quad (19)$$

According to the above-described equation, in an ideal status, it is possible to maintain the accuracy by using the degree of modulation $M_1$ as the sensor output. However, in practical cases, $\eta_1,\eta_2,\eta_A \neq 1$. Therefore, when R=0, the degree of modulation $M_1$ is obtained as follows based on the above-described equation (2).

$$M_1=\eta_1\eta_2\eta_A*(1/2)P_0(1+2\theta_F)-(1/2)P_0=(1/2)P_0\{\eta_1\eta_2\eta_A(1+2\theta_F)-1\} \quad (20)$$

In the above-described the equation, it is clear that $M_1 \neq \theta_F$ unless $\eta_1\eta_2\eta_A=1$. Therefore, it is not possible to maintain accuracy of the sensor output even if $M_1$ shown by the equation (19) is calculated. Therefore, the amount of light $P_A$ radiating on the light receiving element 61 is multiplied by a coefficient $G_A$, and moreover, a reference signal $P_R$ which has a proportional relationship with $P_0$ is applied in order to take account of the difficulty of stabilizing a light source in regular cases. In this case, the amount of light $P_R$ radiating on the light receiving element 63 is multiplied by a coefficient $G_R$ as well. That is, as follows.

$$P_A'=G_AP_A \quad (21)$$

$$P_R'=G_RP_R \quad (22)$$

The degree of modulation M1 is obtained by applying the above-described equations (2) and (4) to the equations (21) and (22).

$$M_1 = \left\{ \begin{array}{c} G_A\eta_1\eta_2\eta_A(1-R)(1/2) \\ P_0(1+2\theta_F)-G_R\eta_1\eta_RRP_0 \end{array} \right\} / G_R\eta_1\eta_RRP_0$$
$$= \{G_A\eta_2\eta_A(1-R)(1/2)(1+2\theta_F)-G_R\eta_R R\}/G_R\eta_R R \quad (23)$$

Now, the following equation is applied to the equation (23).

$$(1/2)G_A\eta_2\eta_A(1-R)=G_R\eta_RR=K \quad (24)$$

$$M_1=\{2K\theta_F+(K-K)\}/K=2\theta_F \quad (25)$$

It is possible to adjust $G_A$ and $G_R$ so as to have $M_1=0$ if $\theta_F=0$

It is necessary to take account of conditions as follows in order to constitute an apparatus with characteristics including: an intensity detection method having a simple constitution; functions of setting zero point and adjusting sensitivity; stabilization of set value; quick response; and the like.

i) A value of the received light signal is determined based on both an intensity of the light source and a transmission efficiency of an optical path from the light source to the light receiving elements. These parameters are not determined when the apparatus is assembled but are respectively different with regard to the optical systems.

ii) Because it is necessary to apply a single mode fiber with a small core diameter between the light source and an optical fiber current element, the quantity of light radiated on sensor elements is easily affected from small differences of the optical systems. On the other hand, it is possible to apply a multi-mode fiber with a large diameter for transmitting the light to the light receiving element after passing through the analyser which is arranged very close to the sensor element. Therefore, if difficulties are compared between stabilization of the quantity of light radiated on the sensor element and stabilization of transmission efficiency of the light to the light receiving element after passing through the analyser, stabilization of the quantity of light radiated on the sensor element is more difficult than the later one.

Based on the above-described studies, it is understood that the following is effective for constituting a DC detection apparatus using intensity modulation.

a) The optical system and the signal operation system are arranged and adjusted in a manner in which values of the signals are adjusted by using optical or electrical methods in order to calibrate the output so as to be zero when the measured current is zero.

b) The optical system and the signal operation system are arranged and adjusted in order to prevent fluctuation of the output with regard to the quantity of light radiated on the sensor elements.

Figure 3:
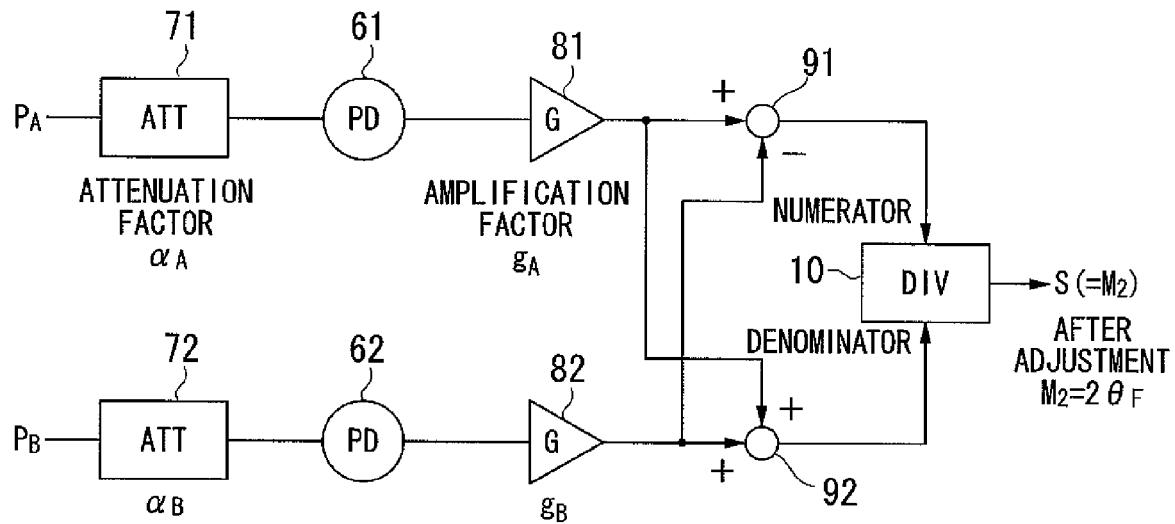
FIG. 3 is a block diagram showing one embodiment of the present invention.

Therefore, in the present invention, the following solutions are applied. FIG. 3 is a drawing which shows a constitution of an embodiment of the present invention. FIG. 3 shows an example of a basic constitution of signal operation which can adjust the coefficients $G_A$, $G_B$ and $G_R$ so as to satisfy the equation (17) of the two-signal method.

For example, the quantity of light $P_A$ and $P_B$ obtained by dividing the sensor output light into two elements having polarized waves which are orthogonally crossing each other, is respectively lead to the light receiving elements (PD) 61 and 62 via a variable optical attenuators (ATT) 71 and 72. Variable amplifiers (G) 91 and 82 are inserted with regard to the output signals from the light receiving elements (PD). It should be noted that 91 is a subtractor, 92 is an adder, 10 is a divider (DIV).

In the adjustment method, (1) in a state in which the measured current=0, (2) attenuation factors $\alpha_A$ and $\alpha_B$ of ATT 71 and 72 or amplification factors $g_A$ and $g_B$ of G81 and 82 are adjusted so as to set the output S=0. In accordance with such a method, the equation (17) is satisfied. In other words, $G_A\eta_A=G_B\eta_B$ ... (17) is satisfied. The following equations should be noted.

$$G_A=\alpha_Ag_A \quad (26)$$

$$G_B=\alpha_Bg_B \quad (27)$$

It should be noted that it is not necessary to adjust all of $\alpha_A,\alpha_B,g_A$ and $g_B$ in order to satisfy (17), (26) and (27). It is possible to adjust at least one of 4 parameters.

Figure 4:
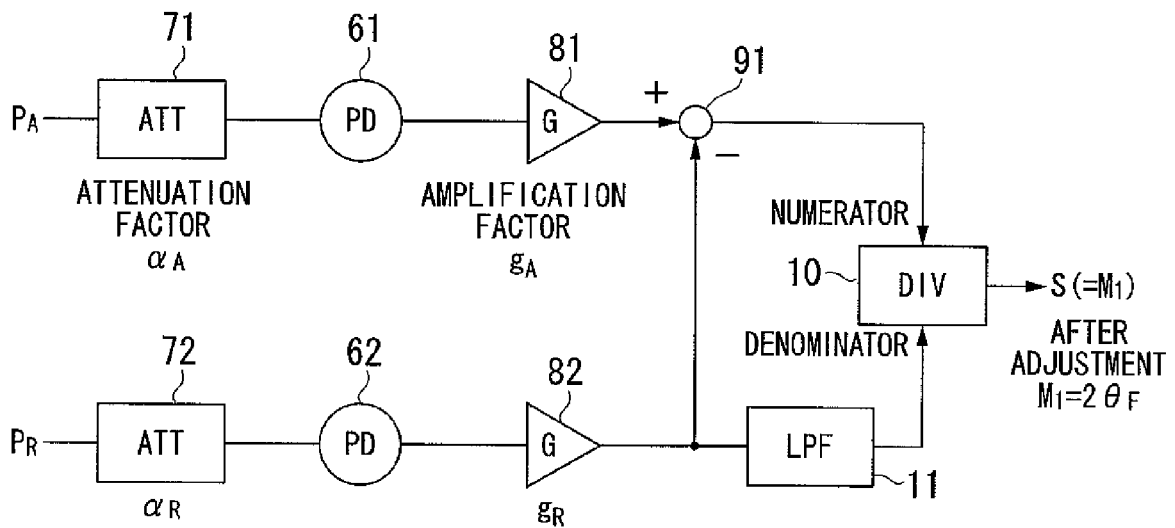
FIG. 4 is a block diagram showing another embodiment of the present invention.

FIG. 4 is a drawing which shows a constitution of another embodiment of the present invention. FIG. 4 shows an example of a basic constitution of a signal operation which can adjust the coefficients $G_A$, $G_B$ and $G_R$ so as to satisfy the equation (24) of the one-signal method.

For example, both a reference beam $P_R$ and one of the quantity of light $P_A$ and $P_B$ obtained by dividing the sensor output light into two elements having polarized waves which are orthogonally crossing each other, are lead to the light receiving elements (PD) 61 and 63 via variable optical attenuators (ATT) 71 and 73. Variable amplifiers (G) 81 and 83 are inserted with regard to the output signals from the light receiving elements (PD). It should be noted that 11 is a low-pass filter (LPF) for canceling effects which are caused if AC elements such as a ripple are included in the reference signal.

The adjustment method is the same as FIG. 3. In the adjustment method, (1) in a state in which the measured current=0, (2) attenuation factors $\alpha_A$ and $\alpha_B$ of ATT 71 and 73 or amplification factors $g_A$ and $g_B$ of G81 and 83 are adjusted so as to set the output S=0. In accordance with such a method, the equation (24) is satisfied. In other words, the following equation is satisfied.

$$(1/2)G_A\eta_2\eta_A(1-R)=G_R\eta_R R=K \qquad (24)$$

Here, the following should be noted.

$$G_A=\alpha_A g_A \qquad (28)$$

$$G_R=\alpha_R g_R \qquad (29)$$

It should be noted that it is not necessary to adjust all of $\alpha_A, \alpha_R, g_A$ and $g_R$ in order to satisfy (24), (28) and (29). It is possible to adjust at least one of 4 parameters.

Figure 5:
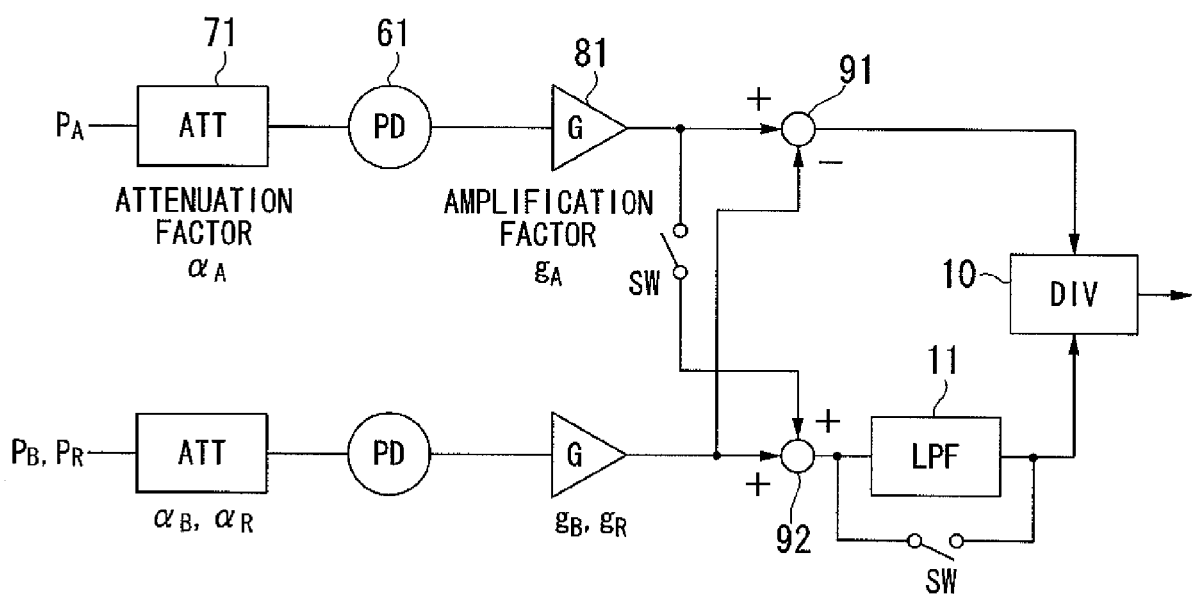
FIG. 5 is a block diagram which can be applied to both FIGS. 3 and 4.

FIG. 5 shows an example of a circuit which can be applied to both FIG. 3 and FIG. 4.

In this case, one of the signals $P_A$ and $P_B$ (here, $P_A$) is lead to the upper side of the circuit and $P_B$ or $P_R$ is selectively lead to the lower side of the circuit. Two switches SW are respectively provided at positions shown in the drawing. Therefore, if the signal $P_B$ is lead to the lower side of the circuit and the switch SW is turned on, it is possible to obtain a circuit shown in FIG. 3. Moreover, if the signal $P_R$ is lead to the lower side of the circuit and the switch SW is turned on, and it is possible to obtain a circuit shown in FIG. 4.

Figure 6A:
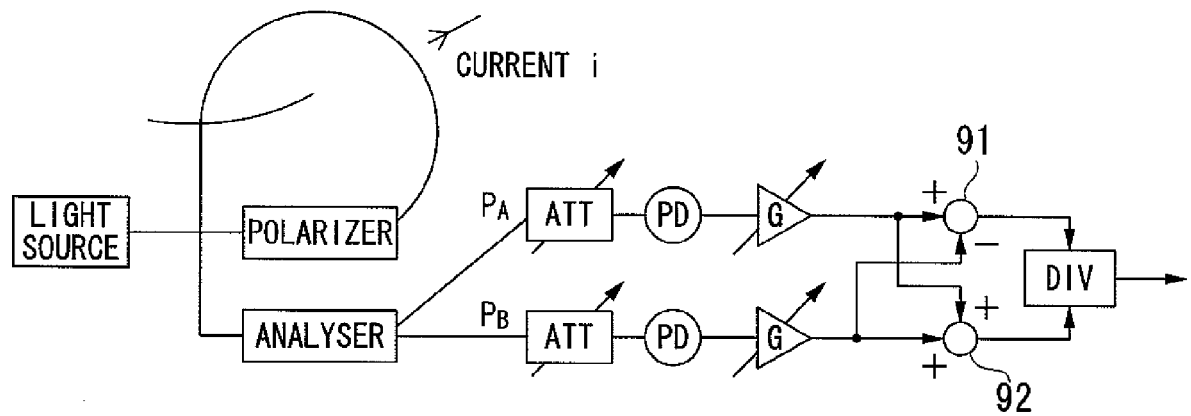
FIG. 6 is a drawing showing a system constitution of a two-signal method.
Figure 6B:
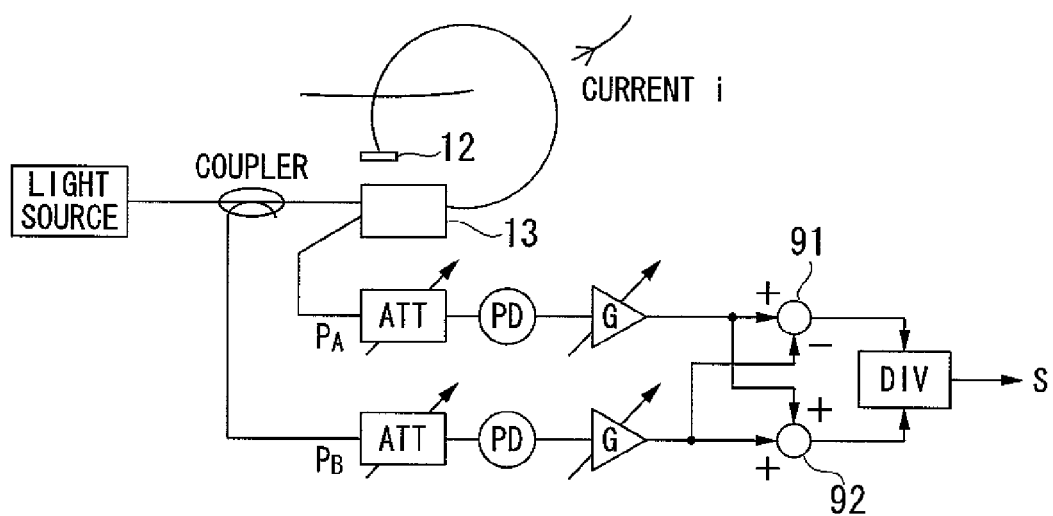
Figure 7A:
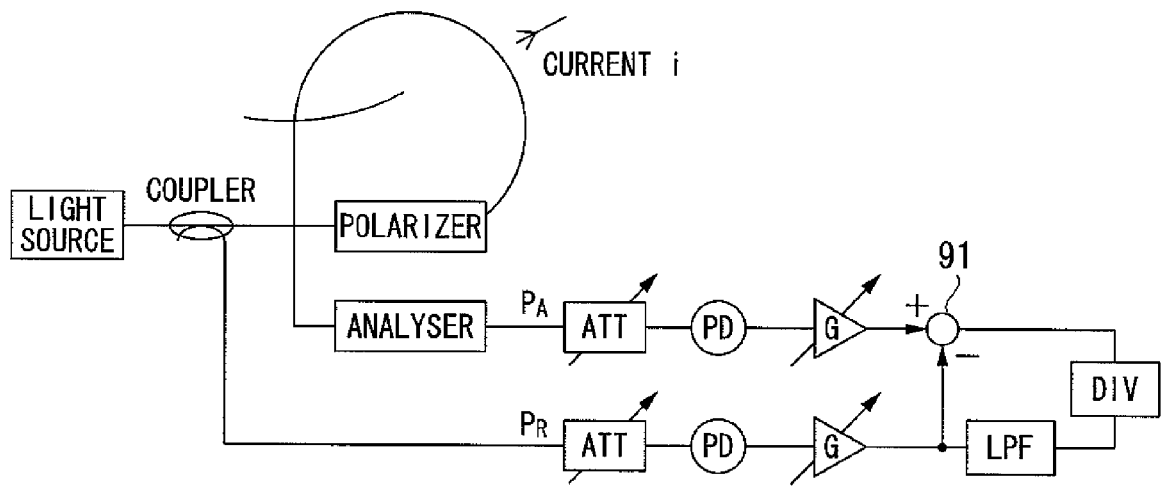
FIG. 7 is a drawing showing a system constitution of a one-signal method.
Figure 7B:
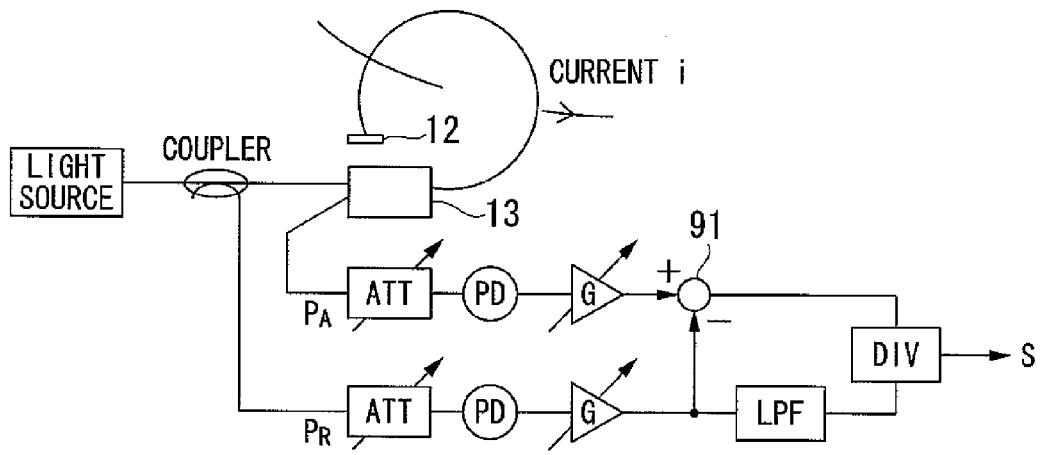
Figure 7C:
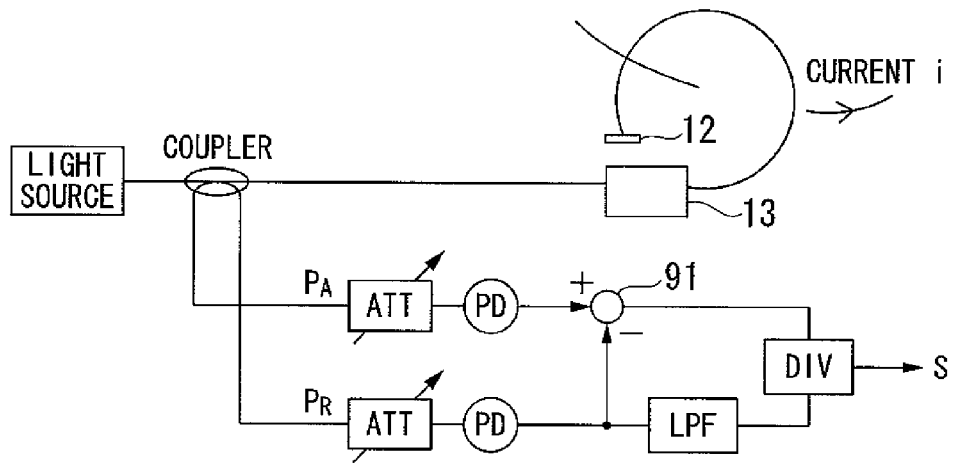
Figure 8:
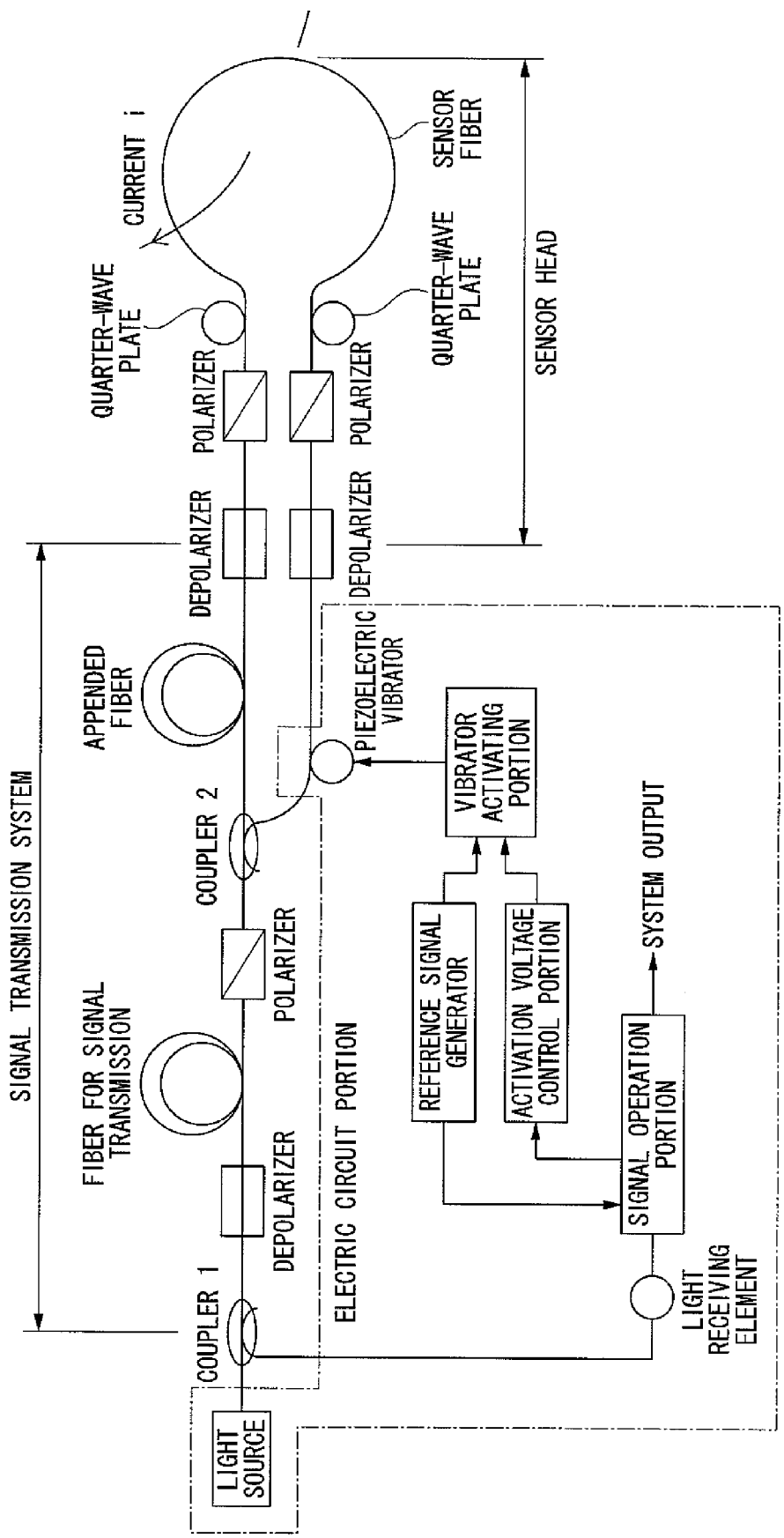
FIG. 8 is a block diagram showing a Sagnac interferometer as a conventional example.

FIGS. 6 and 7 show an overall constitution including the above-described sensor optical system and the above-described signal operation system.

FIG. 6 shows an example of the two-signal method, and FIG. 7 shows an example of the one-signal method. In FIG. 6, (a) is a transmission type, and (b) is a reflection type. In FIG. 7, (a) is a transmission type, (b) is a reflection type (1), and (c) is a reflection type (2). Their functions and effects are the same as described above. Therefore, an explanation is omitted. It should be noted that, in FIG. 6 (*b*) and FIGS. 7 (*b*) and (*c*), a reference numeral 12 is a mirror, 13 is a polarizer/analyser (including functions of both a polarizer and an analyser).

It should be noted that in the above description, the current sensor is mainly explained. However, the present invention can provide an optical voltage sensor by applying Pockels effect in place of the Faraday effect. Therefore, it is possible to provide an optical sensor which detects physical values including current and voltage by applying the present invention.

What is claimed is:

1. An optical sensor, comprising:
a sensor constituted from an optical portion to which light from a light source is lead, and by which light intensity of the light is modulated based on a physical value;
a first light receiving element and a second light receiving element receiving two elements of divided light having polarized waves which are orthogonally crossing each other;
a variable optical attenuator operating light which is received by the first and the second light receiving elements; and
a variable amplifier operating output signals from the first and the second light receiving elements, wherein both a zero point and sensitivity of a sensor output are calibrated based on a light attenuation factor or an amplification factor which is adjusted when a physical value is detected by calculating a ratio between a sum and a difference of outputs of the first and the second light receiving elements.

2. An optical sensor, comprising:
a sensor constituted from an optical portion to which light from a light source is lead, and by which light intensity of the light is modulated based on a physical value;
a first light receiving element and a second light receiving element receiving two elements of divided light having polarized waves which are orthogonally crossing each other;
a third light receiving element directly receiving light from the light source;
a variable optical attenuator operating both light which is received by one of the first and the second light receiving elements and light received by the third light receiving element; and
a variable amplifier operating both an output signal from one of the first and the second light receiving elements and an output signal from the third light receiving element, wherein
both a zero point and sensitivity of a sensor output are calibrated based on a light attenuation factor or an amplification factor which is adjusted when a physical value is detected by calculating a ratio between the output of the third light receiving element and a difference between one of the outputs from the first and second light receiving elements and the third light receiving element.

3. An optical sensor according to claim 1, wherein the optical sensor uses a Faraday effect.

4. An optical sensor according to claim 1, wherein the optical sensor uses Pockels effect.

5. An optical sensor according to claim 2, wherein the optical sensor uses a Faraday effect.

6. An optical sensor according to claim 2, wherein the optical sensor uses Pockels effect.

* * * * *